US 8,487,686 B2

(12) United States Patent
Ironstone et al.

(10) Patent No.: US 8,487,686 B2
(45) Date of Patent: Jul. 16, 2013

(54) ACTIVE GUARDING FOR REDUCTION OF RESISTIVE AND CAPACITIVE SIGNAL LOADING WITH ADJUSTABLE CONTROL OF COMPENSATION LEVEL

(75) Inventors: Joel Ironstone, Toronto (CA); David Wang, Toronto (CA); Frank Zhang, Scarborough (CA); Chung Shing Fan, Toronto (CA); Morrie Altmejd, Toronto (CA); Kenneth Carless Smith, Toronto (CA)

(73) Assignee: Impedimed Limited, Pinkenba, Queensland (AU)

( * ) Notice: Subject to any disclaimer, the term of this patent is extended or adjusted under 35 U.S.C. 154(b) by 338 days.

(21) Appl. No.: 12/594,075

(22) PCT Filed: Mar. 31, 2008

(86) PCT No.: PCT/CA2008/000588
§ 371 (c)(1),
(2), (4) Date: Sep. 30, 2009

(87) PCT Pub. No.: WO2008/119166
PCT Pub. Date: Oct. 9, 2008

(65) Prior Publication Data
US 2010/0109739 A1 May 6, 2010

Related U.S. Application Data

(60) Provisional application No. 60/909,206, filed on Mar. 30, 2007.

(51) Int. Cl.
*H03L 5/00* (2006.01)
(52) U.S. Cl.
USPC .......................................... 327/318; 327/322

(58) Field of Classification Search
USPC ................. 327/306, 307, 315–319, 322, 331, 327/332
See application file for complete search history.

(56) References Cited

U.S. PATENT DOCUMENTS

| 3,316,896 A | 5/1967 | Thomasset |
| 3,851,641 A | 12/1974 | Toole et al. |

(Continued)

FOREIGN PATENT DOCUMENTS

| CA | 2231038 | 11/1999 |
| CA | 2613524 | 1/2007 |

(Continued)

OTHER PUBLICATIONS

International Search report issued in International Application No. PCT/US2008/000588 dated Aug. 13, 2008.

(Continued)

*Primary Examiner* — Hai L Nguyen
(74) *Attorney, Agent, or Firm* — Knobbe Martens Olson & Bear LLP

(57) ABSTRACT

In various embodiments, applicants' teachings are related to an active guarding circuit and method for reducing parasitic impedance signal loading on a signal-transmission channel that is shunted by a parasitic impedance. The presence of an electrical signal on the signal-transmission channel causes a leakage current to flow through the parasitic impedance. In various embodiments, the circuit comprises an amplifier and an impedance, one terminal of the impedance is coupled to the signal-transmission channel. The input of the amplifier is coupled to the signal-transmission channel and the output is coupled to the other terminal of the impedance so as to cause a compensation current to flow through the impedance. The gain of the amplifier and the value of the impedance are selected so that the compensation current has a magnitude substantially equal to the leakage current magnitude.

22 Claims, 8 Drawing Sheets

U.S. PATENT DOCUMENTS

| | | | |
|---|---|---|---|
| 3,871,359 A | 3/1975 | Pacela |
| 4,008,712 A | 2/1977 | Nyboer |
| 4,034,854 A | 7/1977 | Bevilacqua |
| 4,144,878 A | 3/1979 | Wheeler |
| 4,184,486 A | 1/1980 | Papa |
| 4,291,708 A | 9/1981 | Frei et al. |
| 4,314,563 A | 2/1982 | Wheeler |
| 4,365,634 A | 12/1982 | Bare et al. |
| 4,407,288 A | 10/1983 | Langer et al. |
| 4,407,300 A | 10/1983 | Davis |
| 4,450,527 A | 5/1984 | Sramek |
| 4,458,694 A | 7/1984 | Sollish et al. |
| 4,468,832 A | 9/1984 | Batchelor |
| 4,486,835 A | 12/1984 | Bai et al. |
| 4,537,203 A | 8/1985 | Machida |
| 4,539,640 A | 9/1985 | Fry et al. |
| 4,557,271 A | 12/1985 | Stoller et al. |
| 4,583,549 A | 4/1986 | Manoli |
| 4,602,338 A | 7/1986 | Cook |
| 4,617,639 A | 10/1986 | Paine |
| 4,646,754 A | 3/1987 | Seale |
| 4,686,477 A | 8/1987 | Givens et al. |
| 4,688,580 A | 8/1987 | Ko et al. |
| 4,763,660 A | 8/1988 | Kroll et al. |
| 4,793,362 A | 12/1988 | Tedner |
| 4,895,163 A | 1/1990 | Libke et al. |
| 4,905,705 A | 3/1990 | Kizakevich et al. |
| 4,911,175 A | 3/1990 | Shizgal |
| 4,942,880 A | 7/1990 | Slovák |
| 4,951,682 A | 8/1990 | Petre |
| 5,025,784 A | 6/1991 | Shao et al. |
| 5,063,937 A | 11/1991 | Ezenwa et al. |
| 5,143,079 A | 9/1992 | Frei et al. |
| 5,197,479 A | 3/1993 | Hubelbank et al. |
| 5,246,008 A | 9/1993 | Mueller |
| 5,280,429 A | 1/1994 | Withers |
| 5,305,192 A | 4/1994 | Bonte et al. |
| 5,309,917 A | 5/1994 | Wang et al. |
| 5,311,878 A | 5/1994 | Brown et al. |
| 5,372,141 A | 12/1994 | Gallup et al. |
| 5,415,164 A | 5/1995 | Faupel |
| 5,421,344 A | 6/1995 | Popp |
| 5,449,000 A | 9/1995 | Libke et al. |
| 5,465,730 A | 11/1995 | Zadehkoochak et al. |
| 5,469,859 A | 11/1995 | Tsoglin et al. |
| 5,503,157 A | 4/1996 | Sramek |
| 5,505,209 A | 4/1996 | Reining |
| 5,529,072 A | 6/1996 | Sramek |
| 5,544,662 A | 8/1996 | Saulnier et al. |
| 5,557,242 A | 9/1996 | Wetherell |
| 5,588,429 A | 12/1996 | Isaacson et al. |
| 5,596,283 A | 1/1997 | Mellitz |
| 5,704,355 A | 1/1998 | Bridges |
| 5,718,231 A | 2/1998 | Dewhurst et al. |
| 5,732,710 A | 3/1998 | Rabinovich et al. |
| 5,746,214 A | 5/1998 | Brown et al. |
| 5,759,159 A | 6/1998 | Masreliez |
| 5,788,643 A | 8/1998 | Feldman |
| 5,800,350 A | 9/1998 | Coppleson et al. |
| 5,807,251 A | 9/1998 | Wang et al. |
| 5,807,270 A | 9/1998 | Williams |
| 5,807,272 A | 9/1998 | Kun et al. |
| 5,810,742 A | 9/1998 | Pearlman |
| 5,919,142 A | 7/1999 | Boone et al. |
| 6,011,992 A | 1/2000 | Hubbard et al. |
| 6,015,389 A | 1/2000 | Brown |
| 6,018,677 A | 1/2000 | Vidrine et al. |
| 6,122,544 A | 9/2000 | Organ |
| 6,125,297 A | 9/2000 | Siconolfi |
| 6,142,949 A | 11/2000 | Ubby |
| 6,151,523 A | 11/2000 | Ferrer et al. |
| 6,173,003 B1 | 1/2001 | Whikehart et al. |
| 6,228,022 B1 | 5/2001 | Friesem et al. |
| 6,233,473 B1 | 5/2001 | Shepherd et al. |
| 6,236,886 B1 | 5/2001 | Cherepenin et al. |
| 6,248,083 B1 | 6/2001 | Smith et al. |
| 6,256,532 B1 | 7/2001 | Cha |
| 6,292,690 B1 | 9/2001 | Petrucelli et al. |
| 6,339,722 B1 | 1/2002 | Heethaar et al. |
| 6,354,996 B1 | 3/2002 | Drinan et al. |
| 6,496,725 B2 | 12/2002 | Kamada et al. |
| 6,497,659 B1 | 12/2002 | Rafert |
| 6,532,384 B1 | 3/2003 | Fukuda |
| 6,569,160 B1 | 5/2003 | Goldin et al. |
| 6,584,348 B2 | 6/2003 | Glukhovsky |
| 6,618,616 B2 | 9/2003 | Iijima et al. |
| 6,623,312 B2 | 9/2003 | Merry et al. |
| 6,625,487 B2 | 9/2003 | Herleikson |
| 6,631,292 B1 | 10/2003 | Liedtke |
| 6,633,777 B2 | 10/2003 | Szopinski |
| 6,643,543 B2 | 11/2003 | Takehara et al. |
| 6,667,650 B2 * | 12/2003 | Gammie et al. ............... 327/362 |
| 6,714,813 B2 | 3/2004 | Ishigooka et al. |
| 6,714,814 B2 | 3/2004 | Yamada et al. |
| 6,723,049 B2 | 4/2004 | Skladnev et al. |
| 6,724,200 B2 | 4/2004 | Fukuda |
| 6,760,617 B2 | 7/2004 | Ward et al. |
| 6,768,921 B2 | 7/2004 | Organ et al. |
| 6,845,264 B1 | 1/2005 | Skladnev et al. |
| 6,870,109 B1 | 3/2005 | Villarreal |
| 6,906,533 B1 | 6/2005 | Yoshida |
| 6,922,586 B2 | 7/2005 | Davies |
| 7,130,680 B2 | 10/2006 | Kodama et al. |
| 7,148,701 B2 | 12/2006 | Park et al. |
| 7,180,354 B2 * | 2/2007 | Gabillard et al. ............. 327/307 |
| 7,212,852 B2 | 5/2007 | Smith et al. |
| 7,270,580 B2 | 9/2007 | Bradley et al. |
| 7,353,058 B2 | 4/2008 | Weng et al. |
| 7,362,157 B2 * | 4/2008 | Logiudice ...................... 327/318 |
| 7,457,660 B2 | 11/2008 | Smith et al. |
| 7,477,937 B2 | 1/2009 | Iijima et al. |
| 7,642,814 B2 * | 1/2010 | Hu ................................. 327/44 |
| 7,706,872 B2 | 4/2010 | Min et al. |
| 7,733,224 B2 | 6/2010 | Tran |
| 2001/0007056 A1 | 7/2001 | Linder et al. |
| 2001/0007924 A1 | 7/2001 | Kamada et al. |
| 2001/0020138 A1 | 9/2001 | Ishigooka et al. |
| 2001/0025139 A1 | 9/2001 | Pearlman |
| 2002/0020138 A1 | 2/2002 | Walker et al. |
| 2002/0022787 A1 | 2/2002 | Takehara et al. |
| 2002/0072686 A1 | 6/2002 | Hoey et al. |
| 2002/0079910 A1 | 6/2002 | Fukuda |
| 2002/0093991 A1 | 7/2002 | Kurihara et al. |
| 2002/0093992 A1 | 7/2002 | Plangger |
| 2002/0123694 A1 | 9/2002 | Organ et al. |
| 2002/0161311 A1 | 10/2002 | Ward et al. |
| 2002/0163408 A1 | 11/2002 | Fujii et al. |
| 2002/0194419 A1 | 12/2002 | Rajput et al. |
| 2003/0004403 A1 | 1/2003 | Drinan et al. |
| 2003/0023184 A1 | 1/2003 | Pitts-Crick et al. |
| 2003/0028221 A1 | 2/2003 | Zhu et al. |
| 2003/0050570 A1 | 3/2003 | Kodama et al. |
| 2003/0073916 A1 | 4/2003 | Yonce |
| 2003/0105411 A1 | 6/2003 | Smallwood et al. |
| 2003/0120170 A1 | 6/2003 | Zhu et al. |
| 2004/0015095 A1 | 1/2004 | Li et al. |
| 2004/0019292 A1 | 1/2004 | Drinan et al. |
| 2004/0077944 A1 | 4/2004 | Steinberg et al. |
| 2004/0158167 A1 | 8/2004 | Smith et al. |
| 2004/0167423 A1 | 8/2004 | Pillon et al. |
| 2004/0181164 A1 | 9/2004 | Smith et al. |
| 2004/0186392 A1 | 9/2004 | Ward et al. |
| 2004/0204658 A1 | 10/2004 | Dietz et al. |
| 2004/0210150 A1 | 10/2004 | Virtanen |
| 2004/0210158 A1 | 10/2004 | Organ et al. |
| 2004/0252870 A1 | 12/2004 | Reeves et al. |
| 2005/0033281 A1 | 2/2005 | Bowman et al. |
| 2005/0039763 A1 | 2/2005 | Kraemer et al. |
| 2005/0098343 A1 | 5/2005 | Fukuda |
| 2005/0101875 A1 | 5/2005 | Semler et al. |
| 2005/0107719 A1 | 5/2005 | Arad et al. |
| 2005/0113704 A1 | 5/2005 | Lawson et al. |
| 2005/0117196 A1 | 6/2005 | Kimura et al. |
| 2005/0124908 A1 | 6/2005 | Belalcazar et al. |
| 2005/0137480 A1 | 6/2005 | Alt et al. |
| 2005/0151545 A1 | 7/2005 | Park et al. |
| 2005/0177062 A1 | 8/2005 | Skrabal et al. |

| | | | | | | |
|---|---|---|---|---|---|---|
| 2005/0192488 | A1 | 9/2005 | Bryenton et al. | JP | 10014899 | 2/1998 |
| 2005/0203435 | A1 | 9/2005 | Nakada | JP | 10-080406 A | 3/1998 |
| 2005/0261743 | A1 | 11/2005 | Kroll | JP | 10-225521 | 8/1998 |
| 2006/0004300 | A1 | 1/2006 | Kennedy | JP | 11070090 | 3/1999 |
| 2006/0085048 | A1 | 4/2006 | Cory et al. | JP | 2000-107138 | 4/2000 |
| 2006/0085049 | A1 | 4/2006 | Cory et al. | JP | 2000139867 | 5/2000 |
| 2006/0111652 | A1 | 5/2006 | McLeod | JP | 2001-070273 A | 3/2001 |
| 2006/0116599 | A1 | 6/2006 | Davis | JP | 2001-224568 A | 8/2001 |
| 2006/0122523 | A1 | 6/2006 | Bonmassar et al. | JP | 2001321352 | 11/2001 |
| 2006/0122540 | A1 | 6/2006 | Zhu et al. | JP | 2002330938 | 11/2002 |
| 2006/0197509 | A1 | 9/2006 | Kanamori et al. | JP | 2003-116805 | 4/2003 |
| 2006/0224079 | A1 | 10/2006 | Washchuk | JP | 2005-143786 A | 9/2005 |
| 2006/0224080 | A1 | 10/2006 | Oku et al. | JP | 2008022995 | 7/2008 |
| 2006/0264775 | A1 | 11/2006 | Mills et al. | RU | 2112416 | 6/1998 |
| 2006/0270942 | A1 | 11/2006 | McAdams | WO | WO 93/18821 | 9/1993 |
| 2007/0010758 | A1 | 1/2007 | Matthiessen et al. | WO | WO 96/01586 | 1/1996 |
| 2007/0027402 | A1 | 2/2007 | Levin et al. | WO | WO 96/12439 | 5/1996 |
| 2007/0043303 | A1 | 2/2007 | Osypka et al. | WO | WO 96/32652 | 10/1996 |
| 2007/0087703 | A1 | 4/2007 | Li et al. | WO | WO 97/11638 | 4/1997 |
| 2007/0106342 | A1 | 5/2007 | Schumann | WO | WO 97/14358 | 4/1997 |
| 2008/0002873 | A1 | 1/2008 | Reeves et al. | WO | WO 98/06328 | 2/1998 |
| 2008/0004904 | A1 | 1/2008 | Tran | WO | WO 98/23204 | 6/1998 |
| 2008/0009757 | A1 | 1/2008 | Tsoglin et al. | WO | WO 98/33553 | 8/1998 |
| 2008/0009759 | A1 | 1/2008 | Chetham | WO | WO 88/07392 | 10/1998 |
| 2008/0039700 | A1 | 2/2008 | Drinan et al. | WO | WO 00/40955 | 7/2000 |
| 2008/0205717 | A1 | 8/2008 | Reeves et al. | WO | WO 00/79255 | 12/2000 |
| 2008/0319336 | A1 | 12/2008 | Ward et al. | WO | WO 01/50954 | 7/2001 |
| 2009/0043222 | A1 | 2/2009 | Chetham | WO | WO 01/67098 | 9/2001 |
| 2009/0076343 | A1 | 3/2009 | James et al. | WO | 01-78831 A3 | 10/2001 |
| 2009/0076345 | A1 | 3/2009 | Manicka et al. | WO | 02-47548 A1 | 6/2002 |
| 2009/0076350 | A1 | 3/2009 | Bly et al. | WO | WO 02/062214 | 8/2002 |
| 2009/0082679 | A1 | 3/2009 | Chetham | WO | WO 02/094096 | 11/2002 |
| 2009/0105555 | A1 | 4/2009 | Dacso et al. | WO | 02-100267 A1 | 12/2002 |
| 2009/0143663 | A1 | 6/2009 | Chetham | WO | WO 2004/000115 | 12/2003 |
| 2009/0177099 | A1 | 7/2009 | Smith et al. | WO | WO 2004/026136 | 4/2004 |
| 2009/0264776 | A1 | 10/2009 | Vardy | WO | WO 2004/047635 | 6/2004 |
| 2009/0287102 | A1 | 11/2009 | Ward | WO | WO 2004/047638 | 6/2004 |
| 2009/0318778 | A1 | 12/2009 | Dacso et al. | WO | WO 2004/049936 | 6/2004 |
| 2010/0145164 | A1 | 6/2010 | Howell | WO | WO 2004/083804 | 9/2004 |
| 2010/0168530 | A1 | 7/2010 | Chetham et al. | WO | WO 2005/010640 | 2/2005 |
| 2010/0234701 | A1 | 9/2010 | Cho et al. | WO | WO 2005/027717 | 3/2005 |
| 2011/0060239 | A1 | 3/2011 | Gaw | WO | WO 2005018432 | 3/2005 |
| | | | | WO | WO 2005/051194 | 6/2005 |
| | | | | WO | WO 2005/122888 | 12/2005 |
| | | | | WO | WO 2006/129108 | 12/2006 |

FOREIGN PATENT DOCUMENTS

| | | | | | |
|---|---|---|---|---|---|
| CA | 2615845 | 1/2007 | WO | WO 2006/129116 | 12/2006 |
| DE | 2912349 | 10/1980 | WO | WO 2007/002991 | 1/2007 |
| EP | 0249823 | 12/1987 | WO | WO 2007/002992 | 1/2007 |
| EP | 349043 | 3/1990 | WO | WO 2007/002993 | 1/2007 |
| EP | 0357309 | 3/1990 | WO | WO 2007/009183 | 1/2007 |
| EP | 377887 | 7/1990 | WO | WO 2007/014417 | 2/2007 |
| EP | 662311 A1 | 7/1995 | WO | WO 2007/041783 | 4/2007 |
| EP | 339471 | 3/1997 | WO | WO 2008/064426 | 6/2008 |
| EP | 865763 | 9/1998 | WO | WO 2008/138062 | 11/2008 |
| EP | 0869360 | 10/1998 | WO | WO 2009/036369 | 3/2009 |
| EP | 1112715 | 4/2001 | WO | WO 2009/100491 | 8/2009 |
| EP | 1146344 | 10/2001 | WO | WO 2011/022068 | 2/2011 |
| EP | 1114610 | 11/2001 | WO | WO 2011/050393 | 5/2011 |
| EP | 1177760 | 2/2002 | WO | WO 2011/075769 | 6/2011 |
| EP | 1219937 | 7/2002 | | | |
| EP | 1238630 | 9/2002 | | | |
| EP | 1338246 | 8/2003 | | | |
| EP | 1452131 | 9/2004 | | | |
| EP | 1553871 | 7/2005 | | | |
| EP | 1629772 | 3/2006 | | | |
| EP | 1247487 | 1/2008 | | | |
| EP | 1903938 | 4/2008 | | | |
| EP | 1909642 | 4/2008 | | | |
| EP | 1948017 | 7/2008 | | | |
| FR | 2486386 | 1/1982 | | | |
| FR | 2748928 | 11/1997 | | | |
| GB | 2131558 | 6/1984 | | | |
| GB | 2260416 | 4/1993 | | | |
| GB | 2426824 | 12/2006 | | | |
| JP | 04-096733 A | 3/1992 | | | |
| JP | 8-191808 | 7/1996 | | | |
| JP | 09051884 | 2/1997 | | | |
| JP | 9220209 | 8/1997 | | | |
| JP | 10000185 | 1/1998 | | | |
| JP | 10014898 | 1/1998 | | | |

OTHER PUBLICATIONS

Abdullah M. Z.; Simulation of an inverse problem in electrical impedance tomography using resistance electrical network analogues; International Journal of Electrical Engineering Education; vol. 36, No. 4, pp. 311-324; Oct. 1999.

Al-Hatib, F.; Patient Instrument connection errors in bioelectrical impedance measurement; Physiological Measurement; vol. 19, No. 2, pp. 285-296; May 2, 1998.

Boulier, a. et al.; Fat-Free Mass Estimation by Two Electrode Impedance Method; American Journal of Clinical Nutrition; vol. 52, pp. 581-585; 1990.

Chaudary, S.S. et al.; Dielectric Properties of Normal & Malignant Human Breast Tissues at Radiowave and Microwave Frequencies; Indian Journal of Biochemistry & Biophysics; vol. 21, No. 1, pp. 76-79; 1984.

Chiolero, R.L. et al.; Assessment of changes in body water by bioimpedance in acutely ill surgical patients; Intensive Care Medicine; vol. 18, pp. 322-326; 1992.

Chumlea et al.; Bioelectrical Impedance and Body Composition: Present Status and Future Directions; Nutrition Reviews; vol. 52, no. 4, pp. 123-131; 1994.

Cornish, B.H. et al.; Quantification of Lymphoedema using Multi-frequency Bioimpedance; Applied Radiation and Isotopes; vol. 49, No. 5/6, pp. 651-652; 1998.

Cornish, B.H. et al.; Bioelectrical impedance for monitoring the efficacy of lymphoedema treatment programmes; Breast Cancer Research and Treatment; vol. 38, pp. 169-176; 1996.

Cornish, B.H. et al.; Data analysis in multiple-frequency bioelectrical impedance analysis; Physiological Measurement; vol. 19, No. 2, pp. 275-283; May 1, 1998.

Cornish, B.H. et al.; Alteration of the extracellular and total body water vols. measured by multiple frequency bioelectrical impedance analysis; Nutrition Research; vol. 14, No. 5, pp. 717-727; 1994.

Cornish, B.H. et al.; Early diagnosis of lymphedema using multiple frequency bioimpedance; Lymphology; vol. 34, pp. 2-11; Mar. 2001.

Cornish, B.H. et al.; Early diagnosis of lymphoedema in postsurgery breast cancer patients; Annals New York Academy of Sciences; pp. 571-575; May 2000.

Dines K.A. et al.; Analysis of electrical conductivity imaging; Geophysics; vol. 46, No. 7, pp. 1025-1036; Jul. 1981.

Ellis, K.J. et al; Human hydrometry: comparison of multifrequency bioelectrical impedance with 2H20 and bromine dilution; Journal of Applied Physiology; vol. 85, No. 3, pp. 1056-1062; 1998.

Forslund, a.H. et al.; Evaluation of modified multicompartment models to calculate body composition in healthy males; American Journal of Clinical Nutrition; vol. 63, pp. 856-62; 1996.

Gersing, E.; Impedance spectroscopy on living tissue for determination of the state of Organs; Bioelectrochemistry and Bioenergetics; vol. 45, pp. 145-149; 1998.

Gerth, W.A. et al.; A computer-based bioelectrical impedance spectroscopic system for noninvasive assessment of compartmental fluid redistribution; Third Annual IEEE Symposium on Computer Based Medical Systems, 3-6 Jun. 1990, University of NC. At Chapel Hill; pp. 446-453; Jun. 1990.

Gudivaka R. et al; Single- and multifrequency models for bioelectrical impedance analysis of body water compartments; Applied Physiology; vol. 87, Issue 3, pp. 1087-1096; 1999.

Jones, C.H. et al; Extracellular fluid volume determined by bioelectric impedance and serum albumin in CAPD patients; Nephrology Dialysis Transplantation; vol. 13, pp. 393-397; 1998.

Jossinet, J. et al.; A Study for Breast Imaging with a Circular Array of Impedance Electrodes; Proc. Vth Int. Conf. Bioelectrical Impedance, 1981, Tokyo, Japan; pp. 83-86; 1981.

Jossinet, J. et al.; Technical Implementation and Evaluation of a Bioelectrical Breast Scanner; Proc.10.sup.th Int. Conf. IEEE Engng. Med. Biol., 1988, New Orleans, USA (Imped. Imaging II); vol. 1. P. 289; 1988.

Kanai, H. et al.; Electrcial Measurment of Fluid Distribution in Legs and Arms; Medical Progress through technology; pp. 159-170; 1987.

Kim, C.T. et al.; Bioelectrical impedance changes in regional extracellular fluid alterations; Electromyography and Clinical Neurophysiology; vol. 37, pp. 297-304; 1997.

Lozano, A. et al.; Two-frequency impedance plethysmograph: real and imaginary parts; Medical & Biological Engineering & Computing; vol. 28, No. 1, pp. 38-42; Jan. 1990.

Liu R. et al; Primary Multi-frequency Data Analyze in Electrical Impedance Scanning; Proceedings of.The IEEE-Embs 2005, 27th Annual International Conference of the Engineering in Medicine and Biology Society, Shanghai, China; pp. 1504-1507; Sep. 1-4, 2005.

Lukaski, H.C. et al.; Estimation of Body Fluid vols. Using Tetrapolar Bioelectrical Impedance Measurements; Aviation, Space, and Environmental Medicine; pp. 1163-1169; Dec. 1998.

Man, B. et al. Results of Preclinical Tests for Breast Cancer Detection by Dielectric Measurements; XII Int. Conf. Med. Biol. Engng. 1979, Jerusalem, Israel. Springer Int., Berlin; Section 30.4; 1980.

McDougal D., et al.; Body Composition Measurements From Whole Body Resistance and Reactance; Surgical Forum; vol. 36, pp. 43-44; 1986.

Osterman K.S. et al.; Multifrequency electrical impedance imaging: preliminary in vivo experience in breast; Physiological Measurement; vol. 21, No. 1, pp. 99-109; Feb. 2000.

Ott, M. et al.; Bioelectrical Impedance Analysis as a Predictor of Survival in Patients with Human Immunodeficiency Virus Infection; Journal of Acquired Immune Deficiency Syndromes and Human Retrovirology; vol. 9, pp. 20-25; 1995

Pethig, R. et al.; The Passive Electrical Properties of Biological Systems: Their Significance in Physiology, Biophysics and Biotechnology; Physics in Medicine and Biology; vol. 32, pp. 933-970; 1987.

Piperno, G. et al.; Breast Cancer Screening by Impedance Measurements; Frontiers of Medical & Biological Engineering; vol. 2, pp. 111-117; 1990.

Rigaud, B. et al.; Bioelectrical Impedance Techniques in Medicine; Critical Reviews in Biomedical Engineering; vol. 24 (4-6), pp. 257-351; 1996.

Schneider, I.; Broadband signals for electrical impedance measurements for long bone fractures; Engineering in Medicine and Biology Society, 1996. Bridging Disciplines for Biomedicine. Proceedings of the 18th Annual International Conference of the IEEE; vol. 5, pp. 1934-1935; Oct. 31, 1996.

Skidmore, R. et al.; A Data Collection System for Gathering Electrical Impedance Measurements from the Human Breast; Clinical Physics Physiological Measurement; vol. 8, pp. 99-102; 1987.

Sollish, B.D. et al.; Micropressor-assisted Screening Techniques; Israel Journal of Medical Sciences; vol. 17, pp. 859-864; 1981.

Steijaert, M. et al.; The use of multi-frequency impedance to determine total body water and extracellular water in obese and lean female individuals; International Journal of Obesity; vol. 21, pp. 930-934; 1997.

Surowiec, A.J. et al.; Dielectric Properties of Brest Carcinima and the Surrounding Tissues; IEEE Transactions on Biomedical Engineering; vol. 35, pp. 257-263; 1988.

Tedner, B.; Equipment Using Impedance Technique for Automatic Recording of Fluid-Volume Changes During Haemodialysis; Medical & Biological Engineering & Computing; pp. 285-290; 1983.

Thomas. B.J.; Future Technologies; Asia Pacific Journal Clinical Nutrition; vol. 4, pp. 157-159; 1995.

Thomas, B.J. et al.; Bioimpedance Spectrometry in Determination of Body Water Compartments: Accuracy and Clinical Significance; Applied Radiation and Isotopes; vol. 49, No. 5/6, pp. 447-455; 1998.

Thomas. B.J. et al.; Bioelectrical impedance analysis for measurement of body fluid vols. —A review; Journal of Clinical Engineering; vol. 17, No. 16, pp. 505-510; 1992.

Ulgen, Y. et al.; Electrical parameters of human blood; Engineering in Medicine and Biology Society, 1998. Proceedings of the 20th Annual International Conference of the IEEE; vol. 6, pp. 2983-2986; Nov. 1, 1998.

Ward, L.C. et al.; Determination of Cole parameters in multiple frequency bioelectrical impedance analysis using only the measurement of impedances; Four-frequency fitting; Physiological Measurement; vol. 27, No. 9, pp. 839-850; Sep. 2006.

Ward, L.C. et al.; There is a better way to measure Lymphodema; National Lymphedema Network Newsletter; vol. 7, No. 4, pp. 89-92; Oct. 1995.

Woodrow, G. et al; Effects of icodextrin in automated peritoneal dialysis on blood pressure and bioelectrical impedance analysis; Nephrology Dialysis Transplantation; vol. 15, pp. 862-866; 2000.

Bracco, D. et al., Bedside determination of fluid accumulation after cardiac surgery using segmental bioelectrical impedance, Critical Care Medicine, vol. 26, No. 6, pp. 1065-1070, 1998.

De Luca, F. et al., Use of low-frequency electrical impedance measurements to determine phospoholipid content in amniotic fluid; Physics in Medicine and Biology, vol. 41, pp. 1863-1869, 1996.

Deurenberg, P. et al., Multi-frequency bioelectrical impedance: a comparison between the Cole-Cole modelling and Hanai equations with the classicaly impedance index approach, Annals of Human Biology, vol. 23, No. 1, pp. 31-40, 1996.

Mattar, J.A., Application of Total Body Impedance to the Critically Ill Patient, New Horizons, vol. 4, No. 4, pp. 493-503, 1996.

Ward, L.C. et al., Multi-frequency bioelectrical impedance augments the diagnosis and management of lymphoedema in post-mastectomy patients, European Journal of Clinical Investigation, vol. 22, pp. 751-754, 1992.

Bella, et al., Relations Of Left Ventricular Mass to Fat-Free and Adipose Body Mass: The Strong Heart Study, (1998) Circulation, vol. 98, pp. 2538-2544.

Iacobellis, G., et al. Influence Of Excess Fat On Cardiac Morphology And Function: Study in Uncomplicated Obesity, (2002) Obesity Research, vol. 10, Pp. 767-773.

Karason, K., et al., Impact Of Blood Pressure And Insulin On The Relationship Between Body Fat And Left Ventricular Structure, (2003) European Heart Journal, vol. 24, pp. 1500-1505.

Yoshinaga, M., Effect Of Total Adipose Weight And Systemic Hypertension On Left Ventricular Mass In Children, American Journal of Cardiology, (1995) vol. 76, Pp. 785-787.

McCullagh, Wa et al., Bioelectrical impedance analysis measures the ejection fraction of the calf muscle pump, IFMBE Proceedings, 2007, vol. 17, pp. 619-619.

* cited by examiner

ACTIVE GUARDING FOR REDUCTION OF RESISTIVE AND CAPACITIVE SIGNAL LOADING WITH ADJUSTABLE CONTROL OF COMPENSATION LEVEL

RELATED APPLICATIONS

This application is a U.S. National Phase under 35 U.S.C. 371 of the International Patent Application No. PCT/CA08/000,588, filed Mar. 31, 2008, and published in English on Oct. 9, 2008 as WO 2008/119166, which claims the benefit of U.S. Provisional Application No. 60/909,206, filed Mar. 30, 2007, both of which are incorporated by reference in their entirety.

The section headings used herein are for organizational purposes only and are not to be construed as limiting the subject matter described in any way.

FIELD

Applicants' teachings are related to a method and circuit for reducing resistive and capacitive signal loading.

SUMMARY

In various embodiments, applicants' teachings relate to an active guarding circuit for reducing parasitic impedance signal loading. In various embodiments, the circuit comprises a signal-transmission channel, an impedance, and an amplifier. The signal-transmission channel carries an electrical signal and is shunted by a parasitic impedance having a parasitic impedance value. The electrical signal causes a leakage current having a leakage current magnitude to flow through the parasitic impedance. The impedance has an impedance value, a first terminal and a second terminal; the first terminal is coupled to the signal-transmission channel. The amplifier has an input terminal, an output terminal and a gain. The input terminal of the amplifier is coupled to the signal-transmission channel, the output terminal of the amplifier is coupled to the second terminal of the impedance to provide a compensation current to flow through the impedance, and the gain is selected based on the impedance and parasitic impedance values so that the compensation current has a magnitude substantially equal to the leakage current magnitude.

In some embodiments, the impedance is the parasitic impedance. In various other embodiments, the impedance is separate from the parasitic impedance.

In various embodiments, the gain of the amplifier is substantially equal to 1.

The active guarding circuit as defined in claim 4, wherein the gain and the compensation impedance are selected so that the compensation current magnitude is substantially equal to the leakage current magnitude.

In some embodiments, the gain of the amplifier is greater than 1.

In various embodiments, the impedance includes a capacitance. In some embodiments, the impedance includes a resistance. In some embodiments, the impedance includes both a resistance and a capacitance. In various other embodiments, the impedance is a capacitance. In some other embodiments, the impedance is a resistance.

In various embodiments, applicants' teachings relate to a method of active guarding for reducing parasitic impedance signal loading. The method comprises sensing an electrical signal on the signal-transmission channel, the signal-transmission channel is shunted by a parasitic impedance having a parasitic impedance value, the electrical signal causing a leakage current having a leakage current magnitude to flow through the parasitic impedance. The method further comprises providing an impedance having an impedance value, with a first terminal and a second terminal, the first terminal is coupled to the signal-transmission channel. The method further comprises providing an amplified signal to the second terminal of the impedance to cause a compensation current to flow through the impedance, the amplified signal is equal to the electrical signal multiplied by a gain, the gain is selected based on the impedance value and the parasitic impedance value so that the magnitude of the compensation current is substantially equal to the leakage current magnitude.

In some embodiments, the impedance is provided by the parasitic impedance. In various other embodiments, the impedance is separate from the parasitic impedance.

In various embodiments, the gain of the amplifier is selected to be substantially equal to 1.

In some embodiments, the method further comprises selecting the gain and the compensation impedance such that the compensation current magnitude is substantially equal to the leakage current magnitude.

The active guarding circuit as defined in claim 4, wherein the gain and the compensation impedance are selected so that the compensation current magnitude is substantially equal to the leakage current magnitude.

In some embodiments, the gain of the amplifier is selected to be greater than 1.

In various embodiments, the impedance includes a capacitance. In various embodiments, the impedance includes a resistance. In some embodiments, the impedance includes both a resistance and a capacitance. In various other embodiments, the impedance is a capacitance. In some other embodiments, the impedance is a resistance.

BRIEF DESCRIPTION OF THE DRAWINGS

The skilled person in the art will understand that the drawings, described below, are for illustration purposes only. The drawings are not intended to limit the scope of the applicants' teachings in any way.

DETAILED DESCRIPTION

Figure 1:
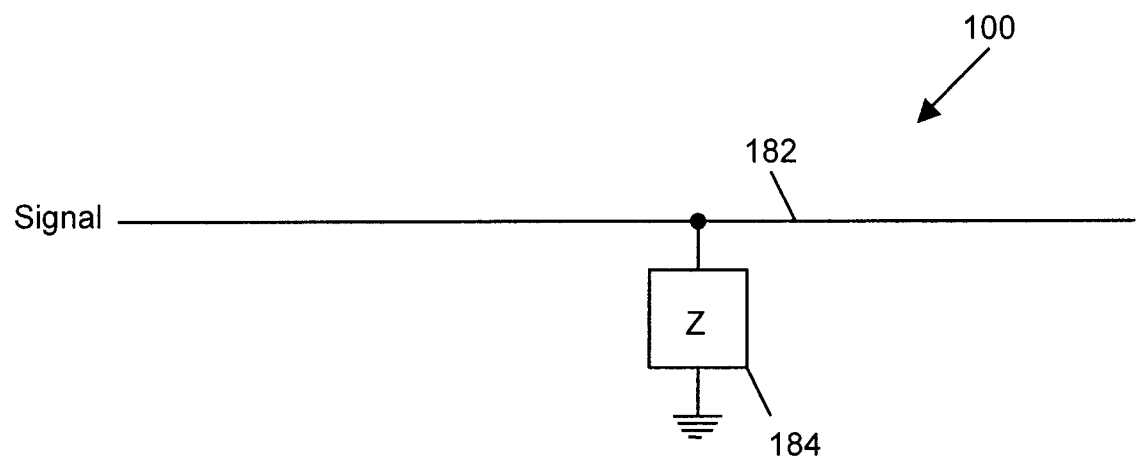
FIG. 1 is a schematic diagram of a signal-transmission channel having a parasitic impedance.

Signals that are transmitted over signal-transmission channels can be attenuated or otherwise distorted. One reason for such distortion and attenuation is that signal-transmission channels often have parasitic impedances coupled to them. FIG. 1 illustrates a circuit 100 that comprises a signal-transmission channel 182 that is shunted by a parasitic impedance 184. Such parasitic impedances may be resistive or capacitive or a combination of the two. The exact value of the parasitic impedance is in part determined by the frequency of the signal passing through the impedance.

As illustrated in FIG. 1, a parasitic impedance may provide a signal with an alternate path to ground. In short, such a parasitic impedance forms a voltage divider with any other load that is coupled to the signal-transmission channel. In this manner, the presence of parasitic impedance may cause attenuation and/or distortion of the signal.

Figure 2:
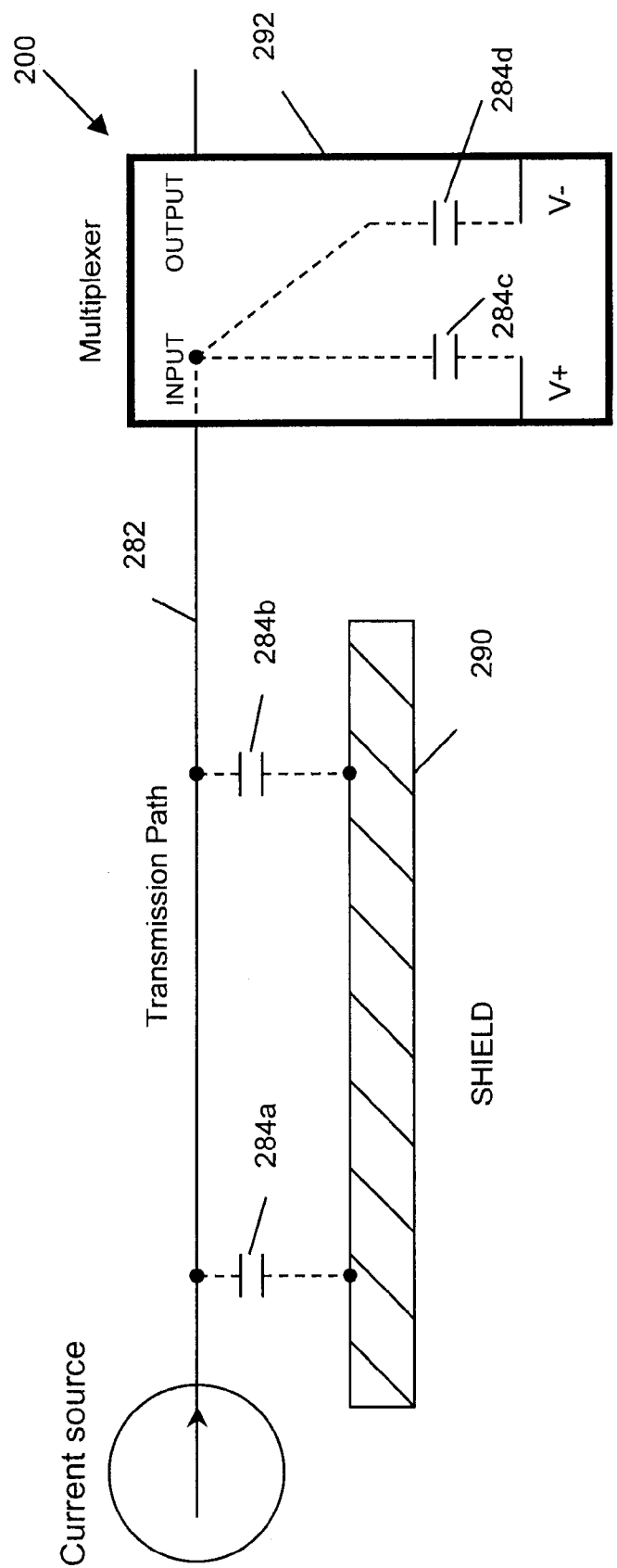
FIG. 2 is a schematic diagram of a portion of a circuit with several sources of parasitic impedances indicated.

Parasitic impedances can arise from a wide variety of sources including but not limited to other signal-transmission channels, other circuit components, and shielding. FIG. 2 illustrates a number of sources of parasitic impedances. Specifically, FIG. 2, is a schematic diagram of a portion of a circuit having a signal-transmission channel 282, several parasitic impedances 284a to 284b, shield 290, and a multiplexer 292.

Shield 290 runs parallel to signal-transmission channel 282 and thereby causes parasitic impedances 284a and 284b to exist between signal-transmission channel 282 and shield 290. Similarly, parasitic impedances 284c and 284d exist between the input of the multiplexer and the power supplies of the multiplexer. FIG. 2 is intended to be illustrative only. Parasitic impedances may exist for a variety of reasons. In addition, although FIG. 2 only illustrates capacitive impedances, the impedances may also be resistive or a combination of resistive and capacitive.

Thus, parasitic impedances may exist in various forms for a variety of reasons in commonly used circuits. The presence of parasitic impedances can cause the signals that are transmitted by these circuits to be attenuated or otherwise distorted. The circuits and methods according to applicant's teachings can be used to minimize or eliminate the negative effects caused by parasitic impedances.

In various embodiments, applicants' teachings are related to an active guarding circuit and method for reducing impedance signal loading. Further, in some embodiments, applicants' teachings are related to a circuit and method for reducing capacitive signal loading. Moreover, in other embodiments, applicants' teachings are related to a circuit and method for reducing resistive signal loading. Furthermore, in some embodiments, applicants' teachings are related to a circuit and method for reducing resistive and capacitive signal loading. In yet other embodiments, applicants' teachings are related to an active guarding circuit and method for reducing impedance signal loading with an adjustable control of level compensation. Applicants' teachings are not intended to be limited to the above-described embodiments.

Figure 3:
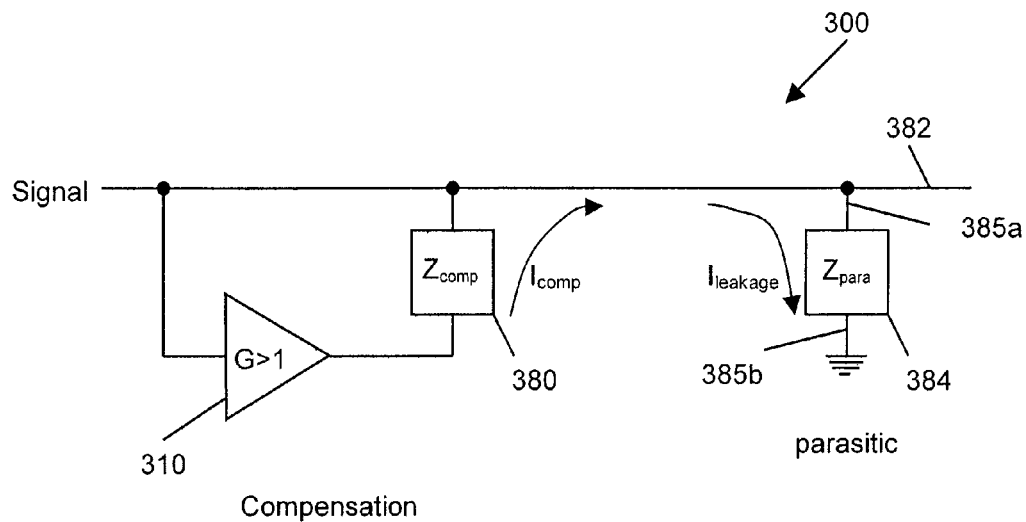
FIGS. 3 to 8 are schematic diagrams of active guarding circuits according to various embodiments of applicants' teachings.

Reference is now made to FIG. 3, which is schematic diagram of an active guarding circuit 300 according to various embodiments of applicants' teachings. Circuit 300 can be created by adding an amplifier 310 and a compensation impedance 380 to the circuit 100 of FIG. 1. More specifically, the input of the amplifier 310 is coupled to the signal-transmission channel 382 and the output is coupled to one terminal of the compensation impedance 380. The other terminal of the compensation impedance is coupled to the signal-transmission channel 382. Parasitic impedance 384 has one terminal 385a connected to signal-transmission channel 382 and a second terminal 385b connected to ground. The terminal of a parasitic impedance, such as terminal 385b, that is not connected to the signal transmission channel of interest, will be referred to as the termination point of the parasitic impedance. The ground node may include but is not limited to small signal ground, such as a power supply terminal.

Compensation impedance 380 and parasitic impedance 384 may be any appropriate impedance including but not limited to a resistance, a capacitance or any appropriate combination, whether in series or parallel, of resistance and capacitance.

Signal-transmission channel 382 may be used to transmit a signal to a load (not shown), which may be any suitable circuit or circuit component. The presence of a signal on signal-transmission channel 382 causes a voltage to appear across parasitic impedance 384. This causes a leakage current $I_{leakage}$ to flow through the parasitic impedance 384. The magnitude of the current flowing through parasitic impedance 384 depends on the value of the impedance as well as the magnitude of the voltage appearing across its terminals.

Amplifier 310 amplifies the signal appearing on the signal-transmission channel 382. In various embodiments amplifier 310 has a gain that is greater than 1. This causes a voltage to appear across compensation impedance 380 and a current $I_{comp}$ to flow through compensation impedance 380.

In various embodiments, the gain of amplifier 310 and the value of the compensation impedance is selected such that the current that flows through parasitic impedance 384 is compensated for by the current that flows through compensation impedance 380. Specifically, given a signal voltage of $V_{signal}$, a parasitic impedance of $Z_{para}$, the leakage current can be said to be:

$$I_{leakage} = V_{signal} \times \left(\frac{1}{Z_{para}}\right) \qquad \text{Equation (1)}$$

Similarly, given a compensation impedance of $Z_{comp}$ and an amplifier gain of G, the compensation current flowing through the compensation impedance may be said to be:

$$I_{comp} = V_{signal} \times (G-1) \times \left(\frac{1}{Z_{comp}}\right) \qquad \text{Equation (2)}$$

Equating equation (1) and equation (2) yields the following:

$$I_{comp} = I_{leakage}$$

$$\left(\frac{G-1}{Z_{comp}}\right) = \frac{1}{Z_{para}} \qquad \text{Equation (3)}$$

Thus, by selecting G and $Z_{comp}$ to satisfy equation (3) the compensation current will exactly match the leakage current. The compensation impedance 380 effectively serves as a negative impedance that cancels the effect of the parasitic impedance 384.

In various embodiments, the value of the parasitic impedance may not be known and therefore it may not be possible to select a gain for the amplifier by simply using equation (3) above. In such embodiments, the value of the gain can be estimated by using circuit 300 of FIG. 3. Specifically, circuit 300 is implemented by selecting a compensation impedance and range of values of gain. The circuit is operated at the various values of gain and the output is monitored. For those values of gain that exceed the required value, the output would oscillate. Thus, the correct value of the gain lies in a range of values that is bounded by (1) the lowest known value of the gain at which the output oscillates and (2) the highest known value of the gain at which the output does not oscillate. This process may be continued in an iterative manner until a suitable value of gain is selected. Once an appropriate value of gain is determined, the parasitic impedance may be estimated by using equation (3) given above.

In various embodiments, the parasitic impedance may be comprised of both parasitic and resistive elements. However, in some embodiments the effect of the capacitive loading can be significantly greater than the effect of the resistive loading.

In such cases, various embodiments of applicants' teachings may be used to address the capacitive loading and not the resistive loading. Alternatively, applicants' teachings may be used to partially compensate for any portion of the parasitic impedance. Thus, in various embodiments, circuits according to applicants' teachings may be used to reduce and/or partially compensate for any leakage currents that may flow through any parasitic impedances coupled to a signal-transmission channel, but not necessarily to completely compensate for all the current that is lost due to leakage currents.

Alternatively, the parasitic impedance may be measured or estimated according to known techniques. The value of the parasitic impedance obtained from this may then be used to select initial values for the compensation impedance and the range of values of gain. The gain can then be fine tuned according to the above-described method.

Figure 4:
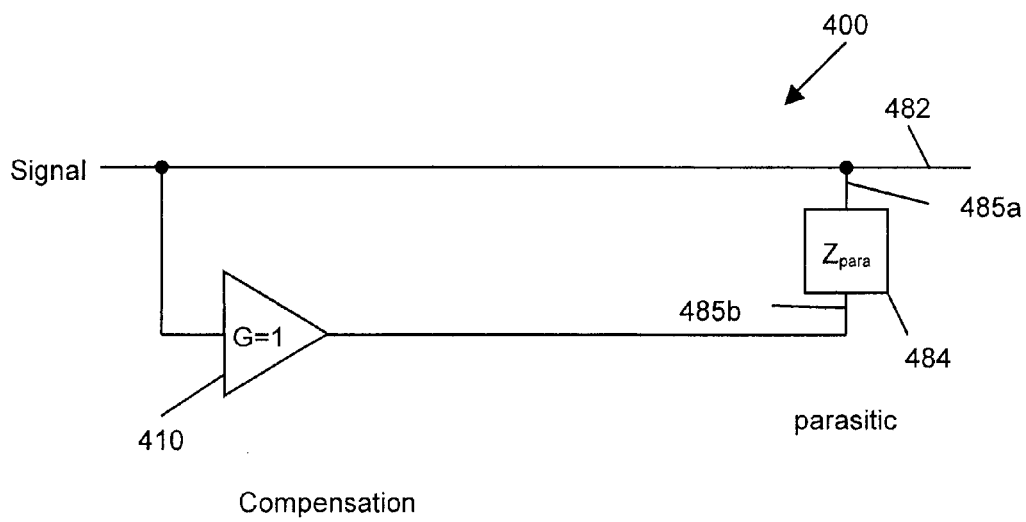

Reference is next made to FIG. 4, which is a schematic diagram of an active guarding circuit 400 according to various embodiments of applicants' teachings. Circuit 400 may be created by applying the output of amplifier 410 to the termination point of parasitic impedance 484. Specifically, in some applications, the termination point, or terminal 485b of parasitic impedance 484 of FIG. 4 may be accessible. In such instances, it may be possible to connect the output of an amplifier to terminal 485b of parasitic impedance 484 and therefore, it may not be necessary to utilize a circuit with a separate compensation impedance.

Circuit 400 can be implemented by connecting the input of amplifier 410 to signal-transmission channel 482 and the output of amplifier 410 to the terminal of the parasitic impedance 484 that is not connected to signal-transmission channel 482.

Signal-transmission channel 482 may be used to transmit a signal to a load, which may be any suitable circuit or circuit component (not illustrated). The presence of a signal on signal-transmission channel 482 causes a voltage to appear across parasitic impedance 484. This causes a leakage current to flow through the parasitic impedance 484. The magnitude of the current flowing through parasitic impedance 484 depends on the value of the impedance as well as the magnitude of the voltage appearing across its terminals.

Amplifier 410 amplifies the signal appearing on the signal-transmission channel 482 and applies the amplified signal to the terminal of parasitic impedance 484 that is not connected to the signal-transmission channel 482. This causes a compensation current to flow through the parasitic impedance 484. In various embodiments, the gain of amplifier 410 is selected to be substantially equal to 1. In such a case, the voltage appearing at the terminal of parasitic impedance 484 that is connected to the output of amplifier 410 is substantially equal to the voltage appearing at the opposite terminal of parasitic impedance 484 thereby causing a compensation current, having an equal magnitude but opposite direction to the leakage current, to flow through parasitic impedance 484. Since the currents are equal in magnitude but opposite in direction, they cancel each other and no current flows through the parasitic impedance 484. Stated another way, a substantially equal voltage potential exists at either terminal of parasitic impedance 484 therefore, no substantial current flows through the parasitic impedance 484.

As shown in the illustrative example of FIG. 4, parasitic impedance 484 serves as both a parasitic impedance and a compensation impedance. Thus, where terminal 485b of parasitic impedance 484 may be accessed, a more simple compensation circuit may be achieved than may be possible when terminal 485b is not accessible. In particular, a separate compensation impedance is not necessary and the gain of the amplifier may be set to 1.

Moreover, in various embodiments, circuit 400 may be utilized without knowing the value of parasitic impedance. In addition, if extra compensation is required, then the gain of the amplifier may be appropriately adjusted as will be explained in greater detail below.

Figure 5:
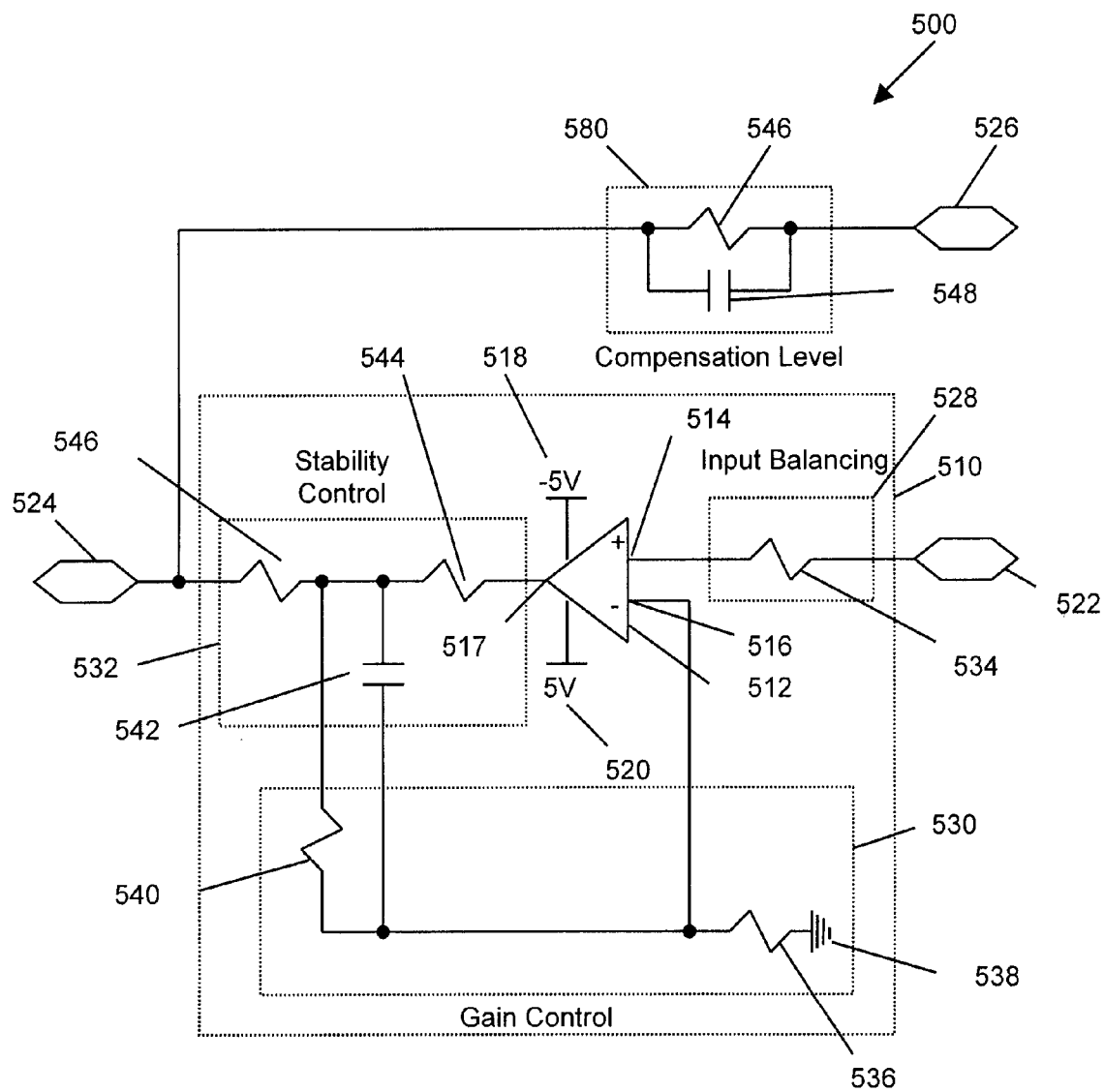

Reference is now made to FIG. 5, which is a detailed schematic diagram of an active guarding circuit 500 according to various embodiments of applicants' teachings. Specifically, circuit 500 may be utilized to implement circuits equivalent to either circuit 300 or 400 as will be explained in greater detail below.

Circuit 500 comprises an amplifier portion 510 which in turn comprises an operational amplifier 512 with a non-inverting input 514, an inverting input 516, an output node 517, and power rails 518 and 520.

Circuit 500 also comprises input node 522, guarding output 524 and negative impedance output 526. More specifically, input node 522 is the node that is connected to a signal-transmission channel. Guarding output 524 is the output utilized when using a configuration similar to that illustrated in FIG. 4. Specifically, if the termination point of a parasitic capacitance is accessible, then guarding output 524 may be used to connect to the termination point of the parasitic impedance. In contrast, negative impedance output 526 is the output that is used to connect to a signal-transmission channel when the termination point of the parasitic impedance is not accessible.

Referring again to the amplifier portion 510, amplifier portion 510 further comprises an input balancing portion 528, a gain control portion 530, and a stability control portion 532. Input balancing portion 528 comprises resistor 534. Gain control portion comprises resistor 536, one terminal of which is connected to ground 538, and resistor 540. By adjusting the values of resistors 536 and 540, one is able to adjust the gain G of the overall amplifier portion 510. In some embodiments, when negative impedance output 526 is utilized the values of resistors 536 and 540 may be set to a value that is greater than 1. In various other embodiments, when guarding output 524 is utilized, the values of resistors 536 and 540 may be selected to provide a gain of greater than 1. Stability control portion 532 comprises capacitor 542, resistor 544, and resistor 546. By adjusting the values of capacitor 542, resistor 544, and resistor 546 one is able to alter the stability of the overall amplifier circuit.

Circuit 500 can also comprise compensation level portion 580, when used in a configuration similar to FIG. 3. Compensation level portion 580 is in turn comprised of resistor 546 and capacitor 548. Compensation level portion 580 is used as the compensation impedance. By adjusting gain control portion 530 and compensation level portion 582, one may adjust the compensation current that is provided to the signal-transmission channel, and thereby match the compensation current magnitude to the magnitude of the leakage current. This may be done according to equation (3) given above. It should be understood however, that in various embodiments, where circuit 500 is used in a configuration similar to FIG. 4, compensation level portion 580 and output 526 can be omitted.

Figure 6:
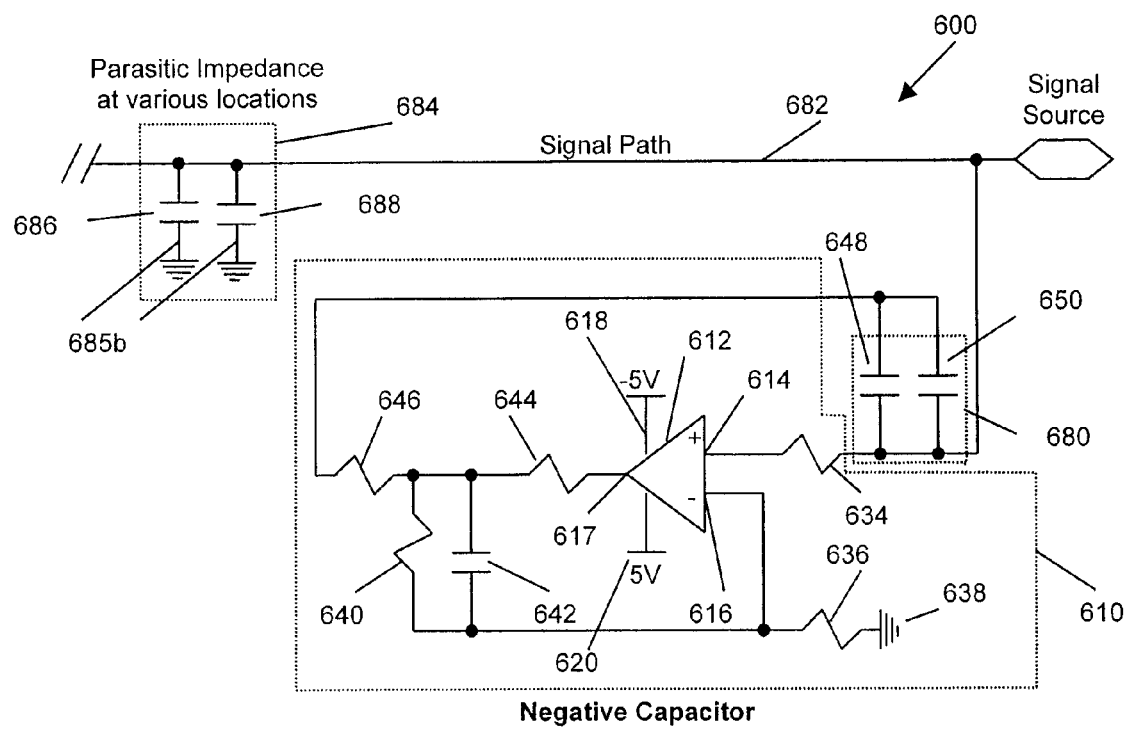

Reference is now made to FIG. 6, which is a detailed schematic diagram of an active guarding circuit 600 according to various embodiments of applicants' teachings. Circuit 600 comprises amplifier 610, which is coupled to compensation impedance 680. Both amplifier 610 and compensation impedance 680 are coupled to signal path 682, which has parasitic impedance 684. Parasitic capacitance 684 may be comprised of various impedances such as capacitances 686 and 688, which may be distributed throughout the signal-transmission channel 682. Parasitic capacitances 686 and 688 have termination points 685b. Both compensation impedance 680 and parasitic impedance 684 are illustrated as only containing capacitances. However, it is not intended to exclude embodiments in which compensation impedance 680 and parasitic impedance 684 include resistances or a combination of capacitances and resistances, which may appear as some combination of parallel or serial connections.

Amplifier 610, comprises an operational amplifier 612, with a non-inverting input 614, an inverting input 616, an output node 617, and power rails 618 and 620. Amplifier 610 further comprises resistor 634 connected between the non-inverting input 614 and signal-transmission channel 682. Resistor 636, which is connected between ground 638 and inverting input 616, as well as resistor 640, form a gain control portion. In various embodiments, the values of resistors 636 and 640 are selected to have a gain with a value greater than 1. Capacitor 642, resistor 644 and resistor 646 form a stability control portion.

Capacitors 648 and 650 make up a compensation impedance 680 and are connected between resistor 646 and signal-transmission channel 682. As discussed above, the value of compensation impedance and the gain of the amplifier may be selected according to equation (3) in order to cancel or reduce the effect of the parasitic impedance and the leakage current.

Figure 7:
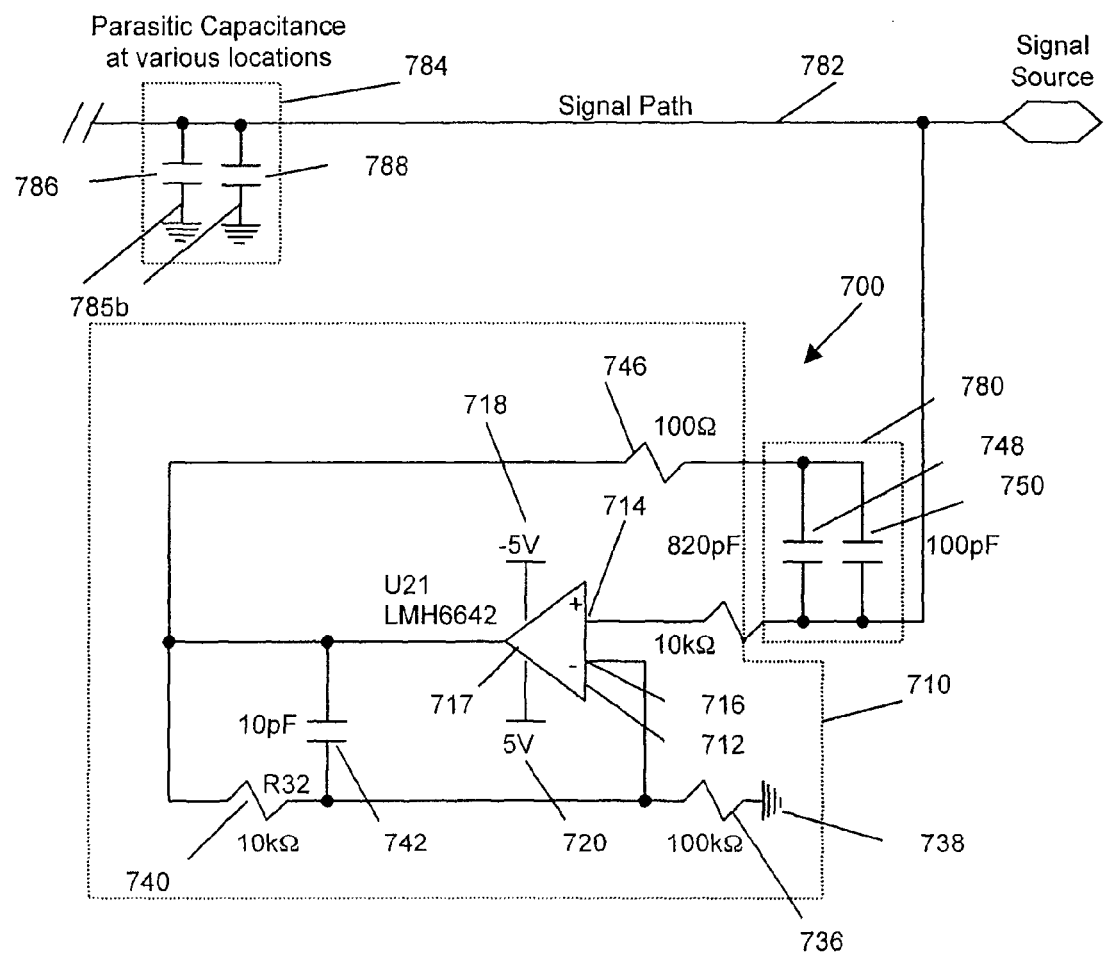

Reference is next made to FIG. 7, which is a detailed schematic diagram of an active guarding circuit 700 according to various embodiments of applicants' teachings. Circuit 700 is illustrated with specific values for various circuit components indicated. Circuit 700 may be utilized to compensate for parasitic capacitance 784 that has a value of 90 pF and appears across a signal-transmission channel 782.

Circuit 700 comprises amplifier 710, which is coupled to compensation impedance 780. Both amplifier 710 and compensation impedance 780 are coupled to the signal-transmission channel 782. The parasitic capacitance 784 could be distributed throughout the signal-transmission channel 782 and be made up of various impedances such as capacitances 786 and 788 having termination points 785b.

Amplifier 710, comprises an operational amplifier 712, which may be, but is not limited to being, implemented as an U21 LMH6642 operation amplifier. Operational amplifier 712 has a non-inverting input 714, an inverting input 716, an output node 717, and power rails 718 and 720. Amplifier 710 further comprises resistor 734 connected between the inverting input 714 and signal-transmission channel 782. Resistor 736 has a value of 100 kΩ and is connected between ground 738 and inverting input 716. Resistor 740 has a value of 10 kΩ and is connected in parallel with capacitor 742. Resistors 738 and 740 form a gain control portion.

Capacitor 742 and resistor 746 form a stability control portion. Capacitor 742 has a value of 10 pF, and resistor 746 has value of 100Ω.

Capacitors 748 and 750 make up a compensation impedance 780 and are connected between resistor 746 and signal-transmission channel 782.

Circuit 700 may be utilized when the termination point of the parasitic impedance is not readily accessible. Specifically, it may not be possible to connect the output of amplifier 710 to terminal 785b of parasitic impedance 784.

Figure 8:
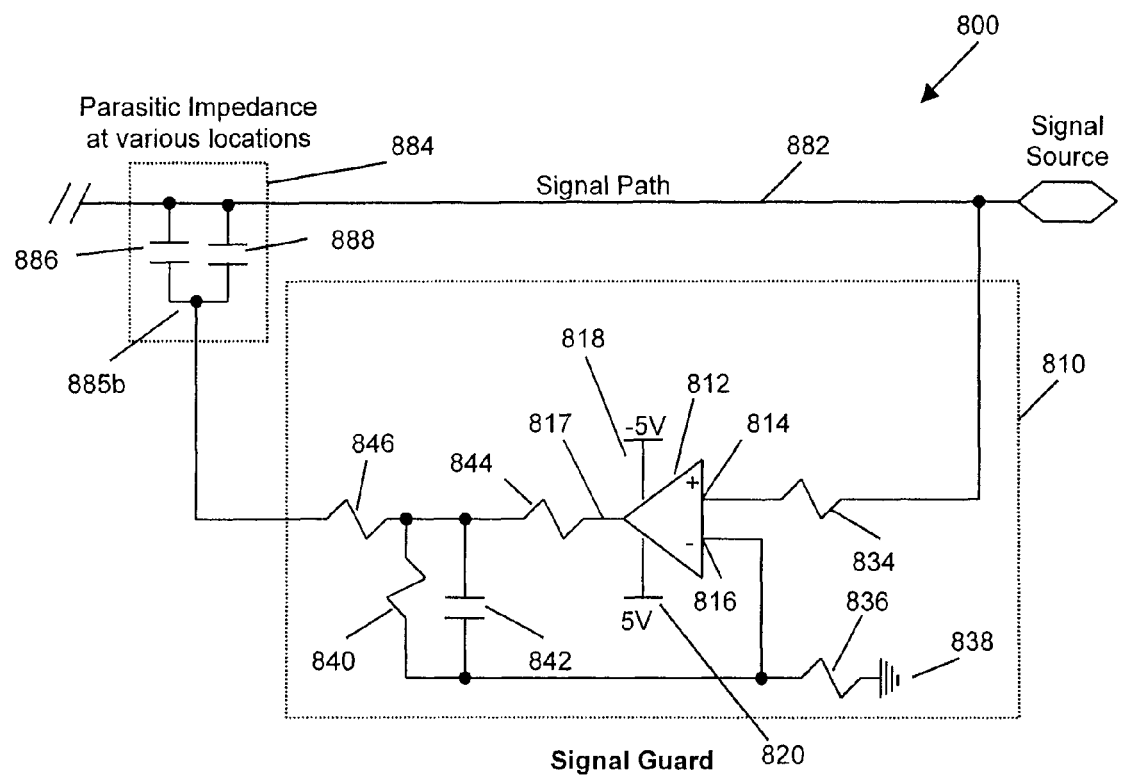

Reference is next made to FIG. 8, which is a detailed schematic diagram of an active guarding circuit 800 according to various embodiments of applicants' teachings. Circuit 800 comprises amplifier 810, the input of which is coupled to signal-transmission channel 882. Signal-transmission channel 882 has parasitic impedance 884. Parasitic impedances 884 may be comprised of various impedances such as capacitances 886 and 888, which may be distributed through out the signal-transmission channel 882. Although parasitic impedance 884 is illustrated of being comprised of only capacitances, it is not intended to exclude embodiments in which parasitic impedance 884 is comprised of resistors, or a combination of resistive and capacitive elements.

The output of amplifier 810 is coupled to node 885b of parasitic impedance 884. Node 885b corresponds to the termination point of parasitic capacitance 884.

Amplifier 810, comprises an operational amplifier 812, with a non-inverting input 814, an inverting input 816, an output node 817, and power rails 818 and 820. Amplifier 810 further comprises resistor 834 connected between the inverting input 814 and signal-transmission channel 882. Resistor 836, which is connected between ground 838 and inverting input 816, as well as resistor 840, form a gain control portion. Capacitor 842, resistor 844 and resistor 846 form a stability control portion.

Circuit 800 may be utilized when the termination point, or terminal 885b, of the parasitic impedance 884 is readily accessible. Specifically, the output of amplifier 810 is connected to terminal 885b of parasitic impedance 884.

The use of any circuit components such as amplifiers may introduce delays into circuits. If the delay is significant then the circuit may not adequately compensate for any leakage current that is lost through the parasitic impedance. This may result in signal distortion. Various embodiments of the circuits illustrated above may overcome the difficulties associated with delays by utilizing amplifiers with a sufficient bandwidth so as not to introduce a delay that is significant when compared to the bandwidth of the signal that is propagated over the signal-transmission channel.

For example, various embodiments of the circuits illustrated above may make use of an operational amplifier when implementing the amplifier for the signal. In some embodiments, the bandwidth of the operational amplifier, such as operational amplifier 812 is selected to be at least 10 times the bandwidth of the signal being propagated over the signal transmission channel. In various embodiments, the signal that is propagated on the signal-transmission channel is a sinusoidal signal. In such cases, the bandwidth of the signal is simply the frequency of the signal, and the bandwidth of the amplifier may be appropriately selected.

An alternative solution for compensating for delay is that a phase lead of an appropriate signal may be added to the amplifier of any of the above signals. This requires that the circuit be able to predict the future values of the signal. In the case of sinusoidal signals, or any other periodic signal, this may be accomplished very easily as the value of such a signal may always be predicted for any future time.

Figure 9:
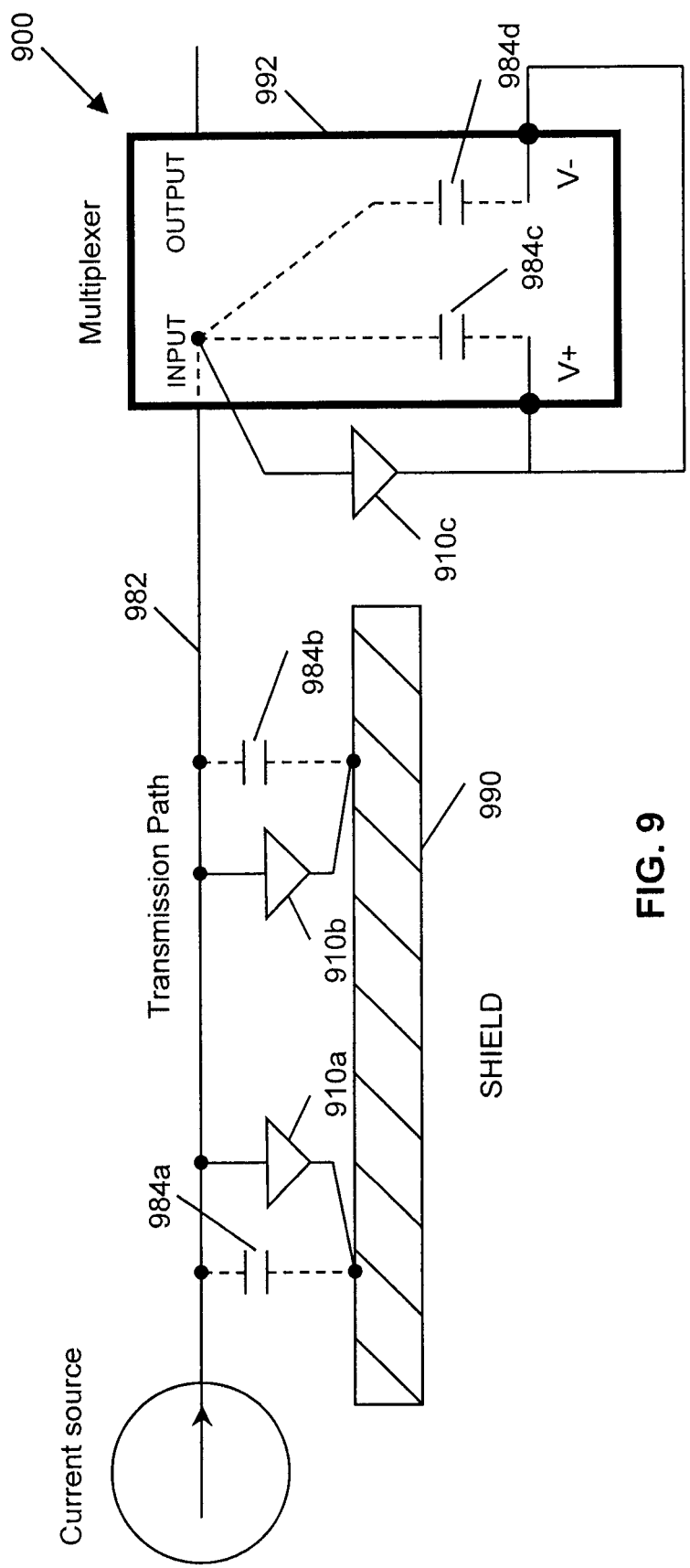
FIG. 9 is a schematic diagram of a portion of a circuit illustrating the application of active guarding circuits according to various embodiments of applicants' teachings.

Reference is now made to FIG. 9, which is a schematic diagram of a circuit 900 according to various embodiments of applicants' teachings. Specifically, FIG. 9, illustrates the application of active guarding circuits according to applicants' teachings to a circuit similar to that illustrated in FIG. 2.

Illustrated in FIG. 9 is a signal-transmission channel 982, several parasitic impedances 984a to 984d, shield 990, and a multiplexer 992. Shield 986 runs parallel to signal-transmission channel 982 and thereby causes parasitic impedances 984a and 984b to exist between signal-transmission channel 982 and shield 986. Similarly, parasitic impedances 984c and 984d exist between the input of the multiplexer and the power supplies of the multiplexer.

Amplifiers 910a, 910b, and 910c are utilized to compensate for any leakage current that may occur. Specifically, the inputs of amplifiers 910a, 910b, and 910c are coupled to the signal-transmission channel and the outputs of amplifiers 910a, 910b, and 910c are coupled to the termination point of impedances 984a to 984d. Each of the amplifiers 910a, 910b, and 910c may be implemented as discussed with respect to FIGS. 4 and 8.

Although FIG. 9 only illustrates capacitive impedances, the impedances may also be resistive or may be any combination of resistances and capacitances connected in series or parallel. It is not intended to exclude any of these combinations. FIG. 9 is intentionally simplified for the purposes of clarity of illustration.

While the applicants' teachings are described in conjunction with various embodiments, it is not intended that the applicants' teachings be limited to such embodiments. On the contrary, the applicants' teachings encompass various alternatives, modifications, and equivalents, as will be appreciated by those of skill in the art.

We claim:

1. An active guarding circuit for reducing parasitic impedance signal loading, the circuit comprising:
    a signal-transmission channel that carries an electrical signal and is shunted by a parasitic impedance having a parasitic impedance value, the electrical signal causes a leakage current having a leakage current magnitude to flow through the parasitic impedance;
    an impedance having an impedance value, a first terminal and a second terminal, the first terminal coupled to the signal-transmission channel; and
    an amplifier having an input terminal, an output terminal and a gain, the input terminal coupled to the signal-transmission channel, the output terminal coupled to the second terminal of the impedance to provide a compensation current to flow through the impedance, and the gain is selected based on the impedance and parasitic impedance values so that the compensation current has a magnitude substantially equal to the leakage current magnitude.

2. The active guarding circuit as defined in claim 1, wherein the impedance is the parasitic impedance.

3. The active guarding circuit as defined in claim 1, wherein the gain is substantially equal to 1.

4. The active guarding circuit as defined in claim 1, wherein the impedance is separate from the parasitic impedance.

5. The active guarding circuit as defined in claim 4, wherein the gain and the compensation impedance are selected so that the compensation current magnitude is substantially equal to the leakage current magnitude.

6. The active guarding circuit as defined in claim 4, wherein the gain is greater than 1.

7. The active guarding circuit as defined in claim 1, wherein the impedance includes a capacitance.

8. The active guarding circuit as defined in claim 1, wherein the impedance includes a resistance.

9. The active guarding circuit as defined in claim 1, wherein the impedance includes both a resistance and a capacitance.

10. The active guarding circuit as defined in claim 1, wherein the impedance is a capacitance.

11. The active guarding circuit as defined in claim 1, wherein the impedance is a resistance.

12. A method of active guarding for reducing parasitic impedance signal loading, the method comprising:
    sensing an electrical signal on a signal-transmission channel, the signal-transmission channel is shunted by a parasitic impedance having a parasitic impedance value, the electrical signal causing a leakage current having a leakage current magnitude to flow through the parasitic impedance;
    providing an impedance having an importance value, with a first terminal and a second terminal, the first terminal is coupled to the signal-transmission channel;
    providing an amplified signal to the second terminal of the impedance to cause a compensation current to flow through the impedance, the amplified signal is equal to the electrical signal multiplied by a gain, the gain is selected based on the impedance value and the parasitic impedance value so that the magnitude of the compensation current is substantially equal to the leakage current magnitude.

13. The method as defined in claim 12, wherein the impedance is provided by the parasitic impedance.

14. The method as defined in claim 12, wherein the gain is selected to be equal to 1.

15. The method as defined in claim 12, wherein the impedance is separate from the parasitic impedance.

16. The method as defined in claim 15, further comprising selecting the gain and the compensation impedance such that the compensation current magnitude is substantially equal to the leakage current magnitude.

17. The method as defined in claim 15, wherein the gain is selected to be greater than 1.

18. The method as defined in claim 12, wherein the impedance includes a capacitance.

19. The method as defined in claim 12, wherein the impedance includes a resistance.

20. The method as defined in claim 12, wherein the impedance includes both a resistance and a capacitance.

21. The method as defined in claim 12, wherein the impedance is a capacitance.

22. The method as defined in claim 12, wherein the impedance is a resistance.

* * * * *

UNITED STATES PATENT AND TRADEMARK OFFICE
CERTIFICATE OF CORRECTION

PATENT NO.       : 8,487,686 B2
APPLICATION NO. : 12/594075
DATED            : July 16, 2013
INVENTOR(S)      : Ironstone et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 219 days.

Signed and Sealed this
Eighth Day of September, 2015

Michelle K. Lee
*Director of the United States Patent and Trademark Office*